United States Patent
Ishibashi et al.

(10) Patent No.: US 11,810,781 B2
(45) Date of Patent: Nov. 7, 2023

(54) METHOD OF PROCESSING SUBSTRATE, SUBSTRATE PROCESSING APPARATUS, RECORDING MEDIUM, METHOD OF MANUFACTURING SEMICONDUCTOR DEVICE

(71) Applicant: KOKUSAI ELECTRIC CORPORATION, Tokyo (JP)

(72) Inventors: Kiyohisa Ishibashi, Toyama (JP); Tsukasa Kamakura, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 142 days.

(21) Appl. No.: 17/200,172

(22) Filed: Mar. 12, 2021

(65) Prior Publication Data
US 2021/0305044 A1    Sep. 30, 2021

(30) Foreign Application Priority Data
Mar. 24, 2020 (JP) .................... 2020-052448

(51) Int. Cl.
*H01L 21/02* (2006.01)
*H01L 21/67* (2006.01)

(52) U.S. Cl.
CPC .... *H01L 21/02233* (2013.01); *H01L 21/0214* (2013.01); *H01L 21/02211* (2013.01); *H01L 21/67017* (2013.01)

(58) Field of Classification Search
None
See application file for complete search history.

(56) References Cited

U.S. PATENT DOCUMENTS

| | | |
|---|---|---|
| 2002/0197784 A1 | 12/2002 | Luoh et al. |
| 2003/0040196 A1 | 2/2003 | Lim et al. |
| 2004/0082197 A1 | 4/2004 | Gluschkenkov et al. |
| 2007/0111538 A1 * | 5/2007 | Iyer ................. H01L 21/0217 257/E21.279 |
| 2007/0238320 A1 * | 10/2007 | Bhattacharyya ........... H01L 29/66833 257/E21.21 |
| 2009/0170345 A1 | 7/2009 | Akae et al. |
| 2010/0159711 A1 | 6/2010 | Venkataraman et al. |

(Continued)

FOREIGN PATENT DOCUMENTS

| | | |
|---|---|---|
| CN | 102034702 A | 4/2011 |
| JP | 2001-093898 A | 4/2001 |

(Continued)

OTHER PUBLICATIONS

Taiwan Office Action dated Oct. 25, 2021 for Taiwan Patent Application No. 110102616.

(Continued)

*Primary Examiner* — Asok K Sarkar
(74) *Attorney, Agent, or Firm* — Volpe Koenig

(57) ABSTRACT

There is provided a technique that includes: forming a first film to have a first predetermined film thickness over a substrate by performing a first cycle a first predetermined number of times, the first cycle including non-simultaneously performing: (a1) forming an oxynitride film by supplying a first film-forming gas to the substrate; and (a2) changing the oxynitride film into a first oxide film by supplying a first oxidizing gas to the substrate to oxidize the oxynitride film.

20 Claims, 8 Drawing Sheets

(56) References Cited

U.S. PATENT DOCUMENTS

| | | | |
|---|---|---|---|
| 2011/0076857 A1 | 3/2011 | Akae et al. | |
| 2011/0309452 A1 | 12/2011 | Jeong et al. | |
| 2014/0220711 A1* | 8/2014 | Murakami | C23C 16/509 |
| | | | 118/702 |
| 2017/0162386 A1 | 6/2017 | Hashimoto et al. | |
| 2018/0033607 A1 | 2/2018 | Nakatani et al. | |
| 2018/0108588 A1 | 4/2018 | Aoike et al. | |
| 2019/0385954 A1 | 12/2019 | Rondon et al. | |

FOREIGN PATENT DOCUMENTS

| | | |
|---|---|---|
| JP | 2007-294949 A | 11/2007 |
| JP | 2010-087167 A | 4/2010 |
| KR | 10-2011-0035935 A | 4/2011 |
| WO | 2016/027369 A1 | 2/2016 |

OTHER PUBLICATIONS

Japan Office Action dated Feb. 1, 2022 for Japan Patent Application No. 2020-052448.
Singapore Search Report dated Feb. 10, 2022 for Singapore Patent Application No. 10202102524X.
Singapore Written Opinion dated Feb. 10, 2022 for Singapore Patent Application No. 10202102524X.
Korean Office Action dated Nov. 24, 2022 for Korean Patent Application No. 10-2021-0033340.
Chinese Office Action dated Jul. 20, 2023 for Chinese Patent Application No. 202011642695.5.

* cited by examiner

METHOD OF PROCESSING SUBSTRATE, SUBSTRATE PROCESSING APPARATUS, RECORDING MEDIUM, METHOD OF MANUFACTURING SEMICONDUCTOR DEVICE

CROSS-REFERENCE TO RELATED APPLICATION

This application is based upon and claims the benefit of priority from Japanese Patent Application No. 2020-052448, filed on Mar. 24, 2020, the entire contents of which are incorporated herein by reference.

TECHNICAL FIELD

The present disclosure relates to a method of manufacturing a semiconductor device, a substrate processing apparatus, and a recording medium.

BACKGROUND

In the related art, as a process of manufacturing a semiconductor device, an oxide film-forming process including formation of a nitride film over a substrate and change of the nitride film to an oxide film by oxidizing the nitride film may be often carried out.

SUMMARY

Some embodiments of the present disclosure provide a technique capable of improving a film quality of an oxide film formed over a substrate.

According to some embodiments of the present disclosure, there is provided a technique that includes: forming a first film to have a first predetermined film thickness over a substrate by performing a first cycle a first predetermined number of times, the first cycle including non-simultaneously performing: (a1) forming an oxynitride film by supplying a first film-forming gas to the substrate; and (a2) changing the oxynitride film into a first oxide film by supplying a first oxidizing gas to the substrate to oxidize the oxynitride film.

BRIEF DESCRIPTION OF DRAWINGS

The accompanying drawings, which are incorporated in and constitute a part of the specification, illustrate embodiments of the present disclosure.

DETAILED DESCRIPTION

Embodiments of the Present Disclosure

Some embodiments of the present disclosure will be now described mainly with reference to FIGS. 1 to 4D.

(1) Configuration of Substrate Processing Apparatus

Figure 1:
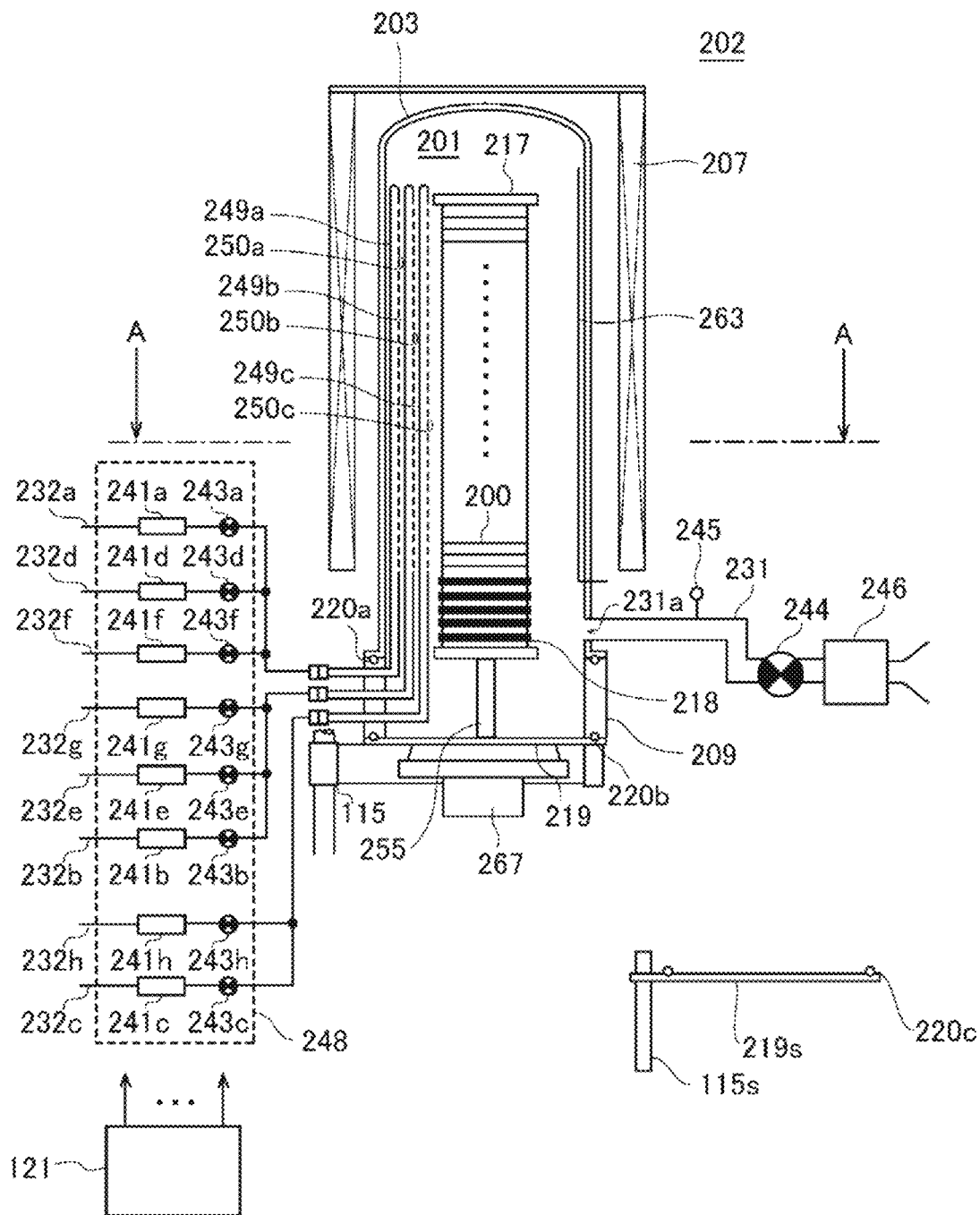
FIG. 1 is a schematic configuration view of a vertical process furnace of a substrate processing apparatus suitably used in some embodiments of the present disclosure, in which a portion of the process furnace 202 is shown in a vertical cross-sectional view.

As illustrated in FIG. 1, a process furnace 202 includes a heater 207 as a temperature regulator (heating part). The heater 207 has a cylindrical shape and is supported by a holding plate to be vertically installed. The heater 207 functions as an activation mechanism (an excitation part) configured to thermally activate (excite) a gas.

A reaction tube 203 is disposed inside the heater 207 to be concentric with the heater 207. The reaction tube 203 is made of a heat resistant material, for example, quartz ($SiO_2$), silicon carbide (SiC) or the like, and has a cylindrical shape with its upper end closed and its lower end opened. A manifold 209 is disposed below the reaction tube 203 in a concentric relationship with the reaction tube 203. The manifold 209 is made of a metal material, for example, stainless steel (SUS), and has a cylindrical shape with its upper and lower ends opened. The upper end of the manifold 209 engages with the lower end of the reaction tube 203. The manifold 209 is configured to support the reaction tube 203. An O-ring 220a as a seal member is installed between the manifold 209 and the reaction tube 203. Similar to the heater 207, the reaction tube 203 is vertically installed. A processing vessel (reaction vessel) mainly includes the reaction tube 203 and the manifold 209. A process chamber 201 is formed in a hollow cylindrical portion of the processing vessel. The process chamber 201 is configured to be capable of accommodating wafers 200 as substrates. The processing of the wafers 200 is performed in the process chamber 201.

Nozzles 249a to 249c as first to third supply parts are installed in the process chamber 201 to penetrate a sidewall of the manifold 209. The nozzles 249a to 249c will be referred to as first to third nozzles, respectively. The nozzles 249a to 249c are each made of a heat resistant material such as quartz, SiC or the like. Gas supply pipes 232a to 232c are connected to the nozzles 249a to 249c respectively. The nozzles 249a to 249c are different nozzles, and each of the nozzles 249a to 249c is installed adjacent to the nozzle 249b.

Mass flow controllers (MFCs) 241a to 241c, which are flow rate controllers (flow rate control parts), and valves 243a to 243c, which are opening/closing valves, are installed at the gas supply pipes 232a to 232c sequentially from the corresponding upstream sides of gas flow, respectively. Gas supply pipes 232d and 232f are respectively connected to the gas supply pipe 232a at the downstream side of the valve 243a. Gas supply pipes 232e and 232g are respectively connected to the gas supply pipe 232b at the downstream side of the valve 243b. A gas supply pipe 232h is connected to the gas supply pipe 232c at the downstream side of the valve 243c. MFCs 241d to 241h and valves 243d to 243h are installed at the gas supply pipes 232d to 232h sequentially from the corresponding upstream sides of gas flow, respectively. The gas supply pipes 232a to 232h are each made of a metal material such as stainless steel (SUS) or the like.

Figure 2:
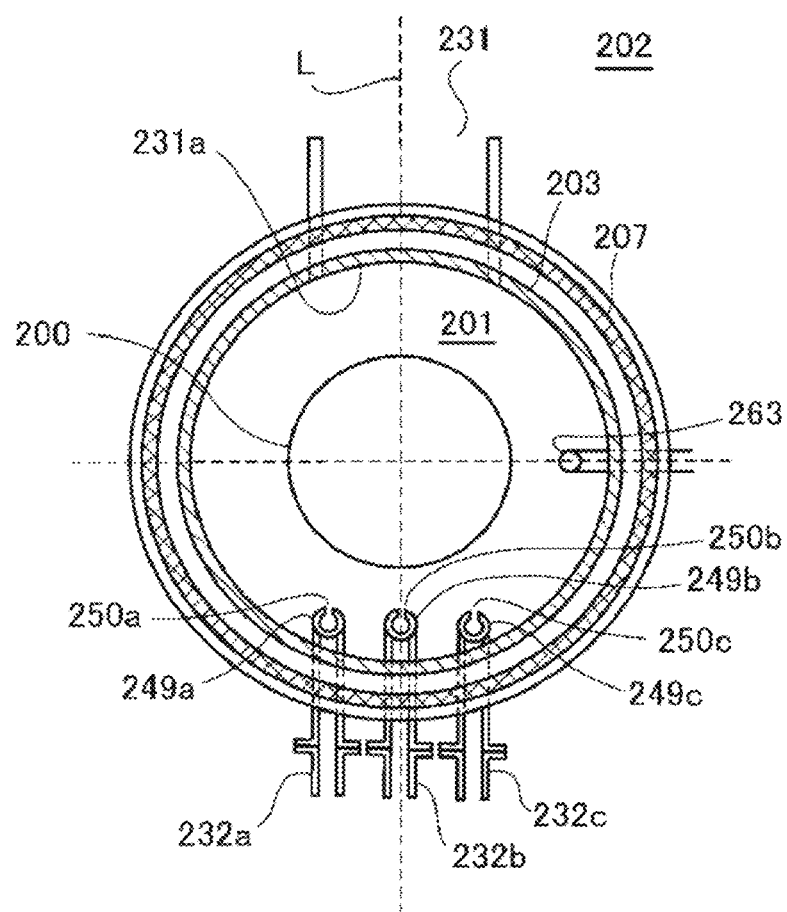
FIG. 2 is a schematic configuration view of the vertical process furnace of the substrate processing apparatus suitably used in some embodiments of the present disclosure, in which a portion of the process furnace 202 is shown in a cross-sectional view taken along a line A-A in FIG. 1.

As illustrated in FIG. 2, the nozzles 249a to 249c are disposed in a space with an annular plane-view shape between the inner wall of the reaction tube 203 and the wafers 200 such that the nozzles 249a to 249c extend upward along an arrangement direction of the wafers 200 from a lower portion to an upper portion of the inner wall of the reaction tube 203. Specifically, the nozzles 249a to 249c are installed at a lateral side of a wafer arrangement region in which the wafers 200 are arranged, namely in a region which horizontally surrounds the wafer arrangement region, to extend along the wafer arrangement region. The nozzle 249b is disposed to face an exhaust port 231a, which is described below, on a straight line in a plane view, with centers of the wafers 200 loaded into the process chamber 201 interposed therebetween. The nozzles 249a and 249c are disposed to sandwich a straight line L passing through the nozzle 249b and a center of the exhaust port 231a from both sides along the inner wall of the reaction tube 203 (an outer peripheral portion of the wafers 200). The straight line L is also a straight line passing through the nozzle 249b and the centers of the wafers 200. That is, it may be said that the nozzle 249c is installed at the opposite side of the nozzle 249a with the straight line L interposed therebetween. The nozzles 249a and 249c are disposed in line symmetry with the straight line L as a symmetry axis. Gas supply holes 250a to 250c configured to supply a gas are installed at the side surfaces of the nozzles 249a to 249c, respectively. The gas supply holes 250a to 250c are opened to face the exhaust port 231a in the plane view, thus allowing a gas to be supplied toward the wafers 200. The gas supply holes 250a to 250c may be formed in a plural number between the lower portion and the upper portion of the reaction tube 203.

A precursor (precursor gas), for example, a silane-based gas which contains silicon (Si) as a main element constituting a film to be formed over each of the wafers 200, is supplied from the gas supply pipe 232a into the process chamber 201 via the MFC 241a, the valve 243a, and the nozzle 249a. As the silane-based gas, it may be possible to use, for example, a gas containing Si and halogen, that is, a halosilane-based gas. The halogen includes chlorine (Cl), fluorine (F), bromine (Br), iodine (I), and the like. As the halosilane-based gas, it may be possible to use, for example, a chlorosilane-based gas containing Si and Cl.

A nitriding gas (nitriding agent), for example, a nitrogen (N)- and hydrogen (H)-containing gas, is supplied from the gas supply pipe 232b into the process chamber 201 via the MFC 241b, the valve 243b, and the nozzle 249b. The N- and H-containing gas is both a N-containing gas and a H-containing gas.

An oxidizing gas (oxidizing agent), for example, an oxygen (O)-containing gas, is supplied from the gas supply pipe 232c into the process chamber 201 via the MFC 241c, the valve 243c, and the nozzle 249c.

A precursor (precursor gas), for example, a silane-based gas which contains Si as a main element constituting a film to be formed over each of the wafers 200, is supplied from the gas supply pipe 232d into the process chamber 201 via the MFC 241d, the valve 243d, the gas supply pipe 232a, and the nozzle 249a. As the silane-based gas, it may be possible to use, for example, a gas containing Si and halogen, that is, a halosilane-based gas. As the halosilane-based gas, it may be possible to use, for example, a chlorosilane-based gas containing Si and Cl.

A reducing gas (reducing agent), for example, a hydrogen (H)-containing gas, is supplied from the gas supply pipe 232e into the process chamber 201 via the MFC 241e, the valve 243e, the gas supply pipe 232b, and the nozzle 249b. The H-containing gas alone does not obtain an oxidation action, but it reacts with an O-containing gas under a specific condition to generate oxidation species such as atomic oxygen (O) or the like and acts to improve an efficiency of oxidizing reaction.

An inert gas is supplied from the gas supply pipes 232f to 232h into the process chamber 201 via the MFCs 241f to 241h, the valves 243f to 243h, the gas supply pipes 232a to 232c, and the nozzles 249a to 249c, respectively. The inert gas acts as a purge gas, a carrier gas, a dilution gas, or the like.

A precursor gas supply system (first precursor gas supply system) mainly includes the gas supply pipe 232a, the MFC 241a, and the valve 243a. A nitriding gas supply system (N- and H-containing supply system) mainly includes the gas supply pipe 232b, the MFC 241b, and the valve 243b. An oxidizing gas supply system (O-containing gas supply system) mainly includes the gas supply pipe 232c, the MFC 241c, and the valve 243c. A precursor gas supply system (second precursor gas supply system) mainly includes the gas supply pipe 232d, the MFC 241d, and the valve 243d. A reducing gas supply system (H-containing gas supply system) mainly includes the gas supply pipe 232e, the MFC 241e, and the valve 243e. An inert gas supply system mainly includes the gas supply pipes 232f to 232h, the MFCs 241f to 241h, and the valves 243f to 243h.

Each or all of the precursor gases, the N- and H-containing gas, and the O-containing gas will be also referred to as a film-forming gas, and each or all of the precursor gas supply system, the N- and H-containing gas supply system, and the O-containing gas supply system will be also referred to as a film-forming gas supply system. Further, each or both of the O-containing gas and the H-containing gas will be also referred to as an oxidizing gas, and each or both of the O-containing gas supply system and the H-containing gas supply system will be also referred to as an oxidizing gas supply system.

One or all of the various gas supply systems described above may be configured as an integrated gas supply system 248 in which the valves 243a to 243h, the MFCs 241a to 241h, and the like are integrated. The integrated gas supply system 248 is connected to each of the gas supply pipes 232a to 232h so that a supply operation of various gases into the gas supply pipes 232a to 232h, that is, an opening/closing operation of the valves 243a to 243h, a flow rate regulating operation by the MFCs 241a to 241h, and the like, is controlled by a controller 121 to be described below.

The integrated gas supply system 248 is configured as an integral or dividable integrated unit, and may be attached to or detached from the gas supply pipes 232a to 232h and the like on an integrated unit basis, such that maintenance, replacement, extension, and the like of the integrated gas supply system 248 may be performed on the integrated unit basis.

The exhaust port 231a configured to exhaust an internal atmosphere of the process chamber 201 is installed at a lower side of the sidewall of the reaction tube 203. As illustrated in FIG. 2, the exhaust port 231a is installed at a position facing the nozzles 249a to 249c (the gas supply holes 250a to 250c) in the plane view, with the wafers 200 interposed therebetween. The exhaust port 231a may be installed between the lower portion and the upper portion of the sidewall of the reaction tube 203, that is, along the wafer arrangement region. An exhaust pipe 231 is connected to the exhaust port 231a. A vacuum pump 246 as a vacuum exhaust device is connected to the exhaust pipe 231 via a pressure sensor 245 as a pressure detector (pressure detection part) which detects the internal pressure of the process chamber 201 and an auto pressure controller (APC) valve 244 as a pressure regulator (pressure regulation part). The APC valve 244 is configured so that a vacuum exhaust and a vacuum exhaust stop of the interior of the process chamber 201 can be performed by opening and closing the APC valve 244 while operating the vacuum pump 246 and so that the internal pressure of the process chamber 201 can be regulated by adjusting an opening degree of the APC valve 244 based on pressure information detected by the pressure sensor 245 while operating the vacuum pump 246. An exhaust system mainly includes the exhaust pipe 231, the APC valve 244 and the pressure sensor 245. The vacuum pump 246 may be regarded as being included in the exhaust system.

A seal cap 219, which serves as a furnace opening lid configured to be capable of hermetically sealing a lower end opening of the manifold 209, is installed under the manifold 209. The seal cap 219 is made of a metal material such as stainless steel (SUS) or the like, and is formed in a disc shape. An O-ring 220b, which is a seal member making contact with the lower end portion of the manifold 209, is installed on an upper surface of the seal cap 219. A rotation mechanism 267 configured to rotate a boat 217 to be described below is installed under the seal cap 219. A rotary shaft 255 of the rotation mechanism 267, which penetrates the seal cap 219, is connected to the boat 217. The rotation mechanism 267 is configured to rotate the wafers 200 by rotating the boat 217. The seal cap 219 is configured to be vertically moved up or down by a boat elevator 115 which is an elevator mechanism installed outside the reaction tube 203. The boat elevator 115 is configured as a transfer device (transfer mechanism) which loads and unloads (transfers) the wafers 200 into and from (out of) the process chamber 201 by moving the seal cap 219 up or down.

A shutter 219s as a furnace opening lid capable of hermetically sealing the lower end opening of the manifold 209, with the boat 217 unloaded from the interior of the process chamber 201 by moving the seal cap 219 down, is installed under the manifold 209. The shutter 219s is made of a metal material such as stainless steel or the like, and is formed in a disc shape. An O-ring 220c as a seal member making contact with the lower end portion of the manifold 209 is installed on an upper surface of the shutter 219s. An opening/closing operation (an elevation movement operation or a rotational movement operation) of the shutter 219s is controlled by a shutter opening/closing mechanism 115s.

The boat 217 serving as a substrate support is configured to support a plurality of wafers 200, for example, 25 to 200 wafers, in such a state that the wafers 200 are arranged in a horizontal posture and in multiple stages along a vertical direction with the centers of the wafers 200 aligned with one another. That is, the boat 217 is configured to arrange the wafers 200 to be spaced apart from each other. The boat 217 is made of a heat resistant material such as quartz or SiC. Heat insulating plates 218 made of a heat resistant material such as quartz or SiC are installed below the boat 217 in multiple stages.

A temperature sensor 263 serving as a temperature detector is installed in the reaction tube 203. Based on temperature information detected by the temperature sensor 263, a state of supplying electric power to the heater 207 is regulated such that the interior of the process chamber 201 has a desired temperature distribution. The temperature sensor 263 is installed along the inner wall of the reaction tube 203.

Figure 3:
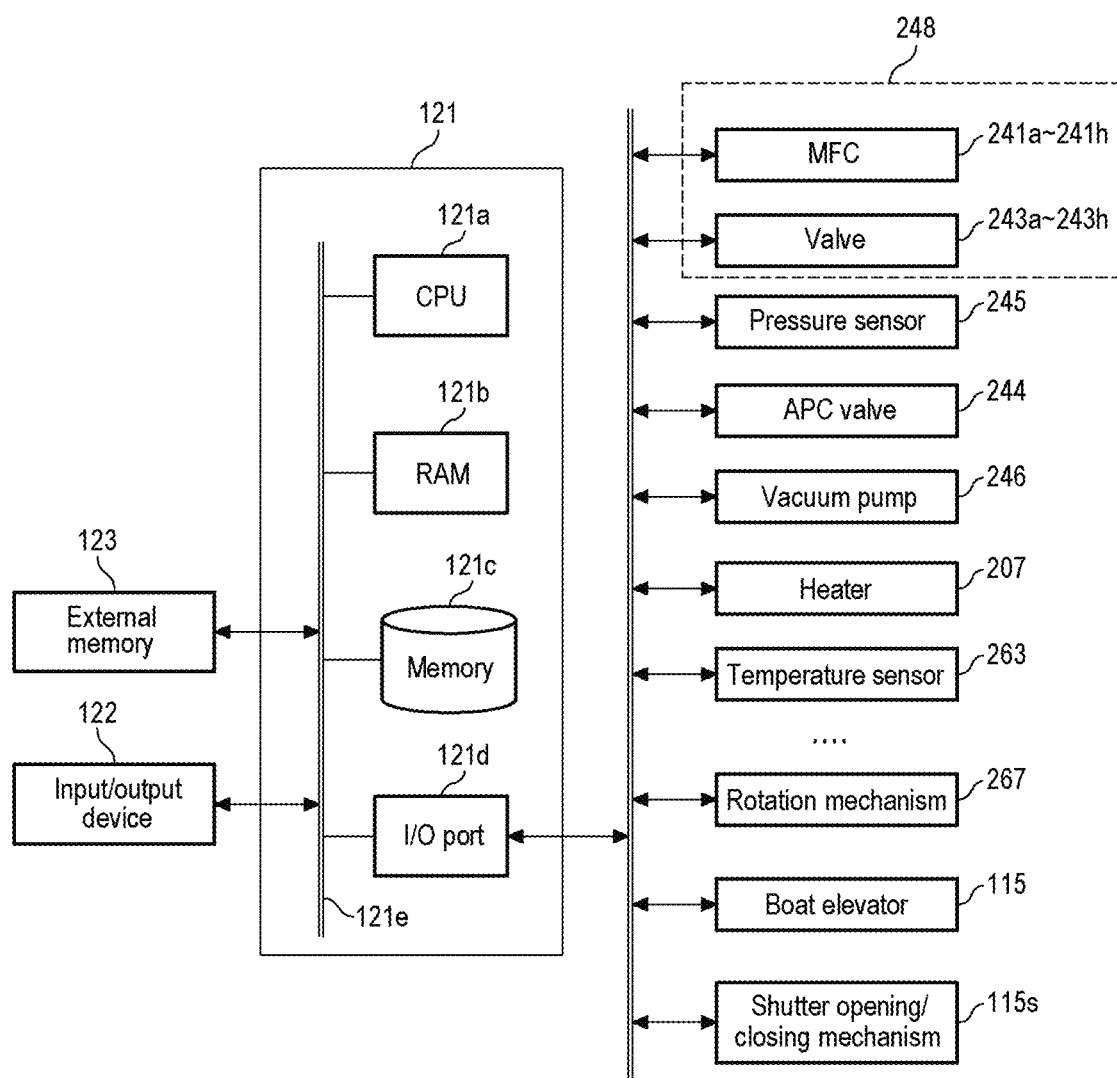
FIG. 3 is a schematic configuration diagram of a controller 121 of the substrate processing apparatus suitably used in some embodiments of the present disclosure, in which a control system of the controller 121 is shown in a block diagram.

As illustrated in FIG. 3, the controller 121, which is a control part (control means), may be configured as a computer including a central processing unit (CPU) 121a, a random access memory (RAM) 121b, a memory 121c, and an I/O port 121d. The RAM 121b, the memory 121c and the I/O port 121d are configured to be capable of exchanging data with the CPU 121a via an internal bus 121e. An input/output device 122 configured as, for example, a touch panel or the like, is connected to the controller 121.

The memory 121c includes, for example, a flash memory, a hard disk drive (HDD), a solid state drive (SSD), and the like. A control program that controls operations of a substrate processing apparatus, a process recipe in which sequences, conditions, and the like of substrate processing to be described below are described, and the like are readably stored in the memory 121c. The process recipe functions as a program configured to be capable of causing the controller 121 to execute each sequence in the substrate processing to be described later to obtain a predetermined result. Hereinafter, the process recipe and the control program will be generally and simply referred to as a "program." Further, the process recipe will be simply referred to as a "recipe." When the term "program" is used herein, it may indicate a case of including only the recipe, a case of including only the control program, or a case of including both the recipe and the control program. The RAM 121b is configured as a memory area (work area) in which a program, data, and the like read by the CPU 121a is temporarily stored.

The I/O port 121d is connected to the MFCs 241a to 241f, the valves 243a to 243f, the pressure sensor 245, the APC valve 244, the vacuum pump 246, the temperature sensor 263, the heater 207, the rotation mechanism 267, the boat elevator 115, the shutter opening/closing mechanism 115s, and the like, as described above.

The CPU 121a is configured to read the control program from the memory 121c and execute the same. The CPU 121a also reads the recipe from the memory 121c according to an input of an operation command from the input/output device 122, and the like. In addition, the CPU 121a is configured to control, according to the contents of the recipe thus read, the flow rate regulating operation of various types of gases by the MFCs 241a to 241f, the opening/closing operation of the valves 243a to 243f, the opening/closing operation of the APC valve 244, the pressure regulating operation performed by the APC valve 244 based on the pressure sensor 245, the driving and stopping of the vacuum pump 246, the temperature regulating operation performed by the heater 207 based on the temperature sensor 263, the operation of rotating the boat 217 and adjusting the rotation speed of the boat 217 with the rotation mechanism 267, the operation of moving the boat 217 up or down with the boat elevator 115, the operation of opening and closing the shutter 219s with the shutter opening/closing mechanism 115s, and the like.

The controller 121 may be configured by installing, on the computer, the aforementioned program stored in an external memory 123. The external memory 123 may include, for example, a magnetic disc such as a HDD, an optical disc such as a CD, a magneto-optical disc such as a MO, a semiconductor memory such as a USB memory and a SSD, and the like. The memory 121c or the external memory 123 is configured as a computer-readable recording medium. Hereinafter, the memory 121c and the external memory 123 will be generally and simply referred to as a "recording medium." When the term "recording medium" is used herein, it may indicate a case of including only the memory 121c, a case of including only the external memory 123, or a case of including both the memory 121c and the external memory 123. Further, the program may be supplied to the computer by using a communication means such as the Internet or a dedicated line, instead of using the external memory 23.

(2) Substrate Processing Process

A processing sequence example of forming an oxide film having a predetermined thickness over a wafer 200 as a substrate by using the aforementioned substrate processing apparatus, which is a process for manufacturing a semiconductor device, will be described mainly with reference to FIGS. 4A to 4D. In the following descriptions, the operations of the respective parts constituting the substrate processing apparatus are controlled by the controller 121.

In a processing sequence according to some embodiments, a SiO film having a predetermined film thickness is formed over a surface of a wafer 200 by performing a cycle a predetermined number of times ($n_2$ times, where $n_2$ is an integer of 1 or more), specifically a plurality of times ($n_2$ times, where $n_2$ is an integer of 2 or more) in some embodiments, the cycle including non-simultaneously performing:

a step of forming a silicon oxynitride film (SiON film) as an oxynitride film by supplying a chlorosilane-based gas which is a precursor gas, a N- and H-containing gas which is a nitriding gas, and an O-containing gas which is an oxidizing gas, as film-forming gases, to the wafer 200 (SiON film formation); and a step of changing the SiON film into a silicon oxide film (SiO film) as an oxide film by supplying an O-containing gas and a H-containing gas, as oxidizing gases, to the wafer 200 to oxidize the SiON film (SiO film change).

In the present disclosure, for the sake of convenience, the above-described processing sequence may be denoted as follows. The same denotation may be used in modifications to be described below. In addition, in the following description, "SiON" denotes "SiON film formation," and "Ox" denotes change from a SiON film into a SiO film by oxidation, that is, "SiO film change."

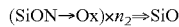
(SiON→Ox)×$n_2$⇒SiO

Further, in the processing sequence according to some embodiments, the SiON film formation includes performing a set a predetermined number of times ($n_1$ times, where $n_1$ is an integer of 1 or more), the set including: a step of supplying a chlorosilane-based gas to the wafer 200; a step of supplying a N- and H-containing gas to the wafer 200; and a step of supplying an O-containing gas to the wafer 200.

Further, in the processing sequence according to some embodiments, the SiO film change includes supplying an O-containing gas and a H-containing gas simultaneously to the wafer 200.

In the present disclosure, for the sake of convenience, the above-described gas supplying sequence may be denoted as follows. The same denotation may be used in modifications to be described below.

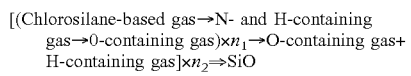
[(Chlorosilane-based gas→N- and H-containing gas→O-containing gas)×$n_1$→O-containing gas+ H-containing gas]×$n_2$⇒SiO When the term "wafer" is used in the present disclosure, it may refer to "a wafer itself" or "a wafer and a stacked body of certain layers or films formed over a surface of the wafer." When the phrase "a surface of a wafer" is used in the present disclosure, it may refer to "a surface of a wafer itself" or "a surface of a certain layer or the like formed over a wafer." When the expression "a certain layer is formed over a wafer" is used in the present disclosure, it may mean that "a certain layer is formed directly over a surface of a wafer itself" or that "a certain layer is formed over a layer or the like formed over a wafer." When the term "substrate" is used in the present disclosure, it may be synonymous with the term "wafer."

(Wafer Charging and Boat Loading)

After the boat 217 is charged with a plurality of wafers 200 (wafer charging), the shutter 219s is moved by the shutter opening/closing mechanism 115s to open the lower end opening of the manifold 209 (shutter open). Thereafter, as illustrated in FIG. 1, the boat 217 charged with the plurality of wafers 200 is lifted up by the boat elevator 115 to be loaded into the process chamber 201 (boat loading). In this state, the seal cap 219 seals the lower end of the manifold 209 via the O-ring 220b.

(Pressure Regulation and Temperature Regulation)

After the boat loading is completed, the interior of the process chamber 201, that is, a space where the wafers 200 are placed, is vacuum-exhausted (decompression-exhausted) by the vacuum pump 246 to reach a desired pressure (degree of vacuum). At this time, the internal pressure of the process chamber 201 is measured by the pressure sensor 245, and the APC valve 244 is feedback-controlled based on the measured pressure information (pressure regulation). Further, the wafers 200 in the process chamber 201 are heated by the heater 207 to have a desired processing temperature. At this time, a state of supplying electric power to the heater 207 is feedback-controlled based on the temperature information detected by the temperature sensor 263 so that the interior of the process chamber 201 has a desired temperature distribution (temperature regulation). Further, the rotation of the wafers 200 by the rotation mechanism 267 is started. The exhaust of the interior of the process chamber 201 and the heating and rotation of the wafers 200 are continuously performed at least until the processing on the wafers 200 is completed.

(Film-Forming Process)

Then, a cycle including non-simultaneously performing: a step of forming a SiON film (SiON film formation); and a step of changing the SiON film into a SiO film by oxidizing the SiON film (SiO film change) is performed a plurality of times ($n_2$ times, where $n_2$ is an integer of 2 or more).

(SiON Film Formation)

In the SiON film formation, a set in which the following steps 1 to 3 are sequentially performed is performed a predetermined number of times ($n_1$ times, where $n_1$ is an integer of 1 or more).

[Step S1]

In the step S1, a chlorosilane-based gas is supplied to the wafer 200 in the process chamber 201.

Specifically, the valve 243a is opened to allow the chlorosilane-based gas to flow through the gas supply pipe 232a. A flow rate of the chlorosilane-based gas is regulated by the MFC 241a, and the chlorosilane-based gas is supplied into the process chamber 201 via the nozzle 249a and is exhausted via the exhaust port 231a.

In this operation, the chlorosilane-based gas is supplied to the wafer 200 (chlorosilane-based gas supply). At this time, the valves 243f to 243h may be opened to allow an inert gas to be supplied into the process chamber 201 via the nozzles 249a to 249c respectively.

Process conditions in this step are exemplified as follows.
Chlorosilane-based gas supply flow rate: 0.01 to 2 slm, specifically 0.1 to 1 slm in some embodiments
Inert gas supply flow rate (for each gas supply pipe): 0 to 10 slm
Each gas supply time: 1 to 120 seconds, specifically 1 to 60 seconds in some embodiments
Processing temperature: 400 to 800 degrees C., specifically 600 to 700 degrees C. in some embodiments
Processing pressure: 1 to 2,666 Pa, specifically 67 to 1,333 Pa in some embodiments In the present disclosure, a notation of a numerical range such as "1 to 2,666 Pa" means that a lower limit value and an upper limit value are included in the range. For example, "1 to 2,666 Pa" means "1 Pa or more and 2,666 Pa or less". The same applies to other numerical ranges.

By supplying the chlorosilane-based gas to the wafer 200 under the above-mentioned conditions, a Si-containing layer containing Cl is formed over the outermost surface of the wafer 200 as a base. The Si-containing layer containing Cl is formed by physical adsorption or chemical adsorption of molecules of the chlorosilane-based gas, chemical adsorption of molecules of substance obtained when a portion of the chlorosilane-based gas is decomposed, deposition of Si by thermal decomposition of the chlorosilane-based gas, and the like over the outermost surface of the wafer 200. The Si-containing layer containing Cl may be an adsorption layer (physical adsorption layer or chemical adsorption layer) of molecules of the chlorosilane-based gas or molecules of substance obtained when a portion of the chlorosilane-based gas is decomposed or may be a deposition layer of Si containing Cl. In the present disclosure, the Si-containing layer containing Cl is also simply referred to as a Si-containing layer.

After the Si-containing layer is formed, the valve 243a is closed to stop the supply of the chlorosilane-based gas into the process chamber 201. Then, the interior of the process chamber 201 is vacuum-exhausted to remove a gas and the like remaining in the process chamber 201 from the interior of the process chamber 201 (purge). At this time, the valves 243f to 243h are opened to allow an inert gas to be supplied into the process chamber 201. The inert gas acts as a purge gas.

As the chlorosilane-based gas, it may be possible to use a monochlorosilane ($SiH_3Cl$, abbreviation: MCS) gas, a dichlorosilane ($SiH_2Cl_2$, abbreviation: DCS) gas, a trichlorosilane ($SiHCl_3$, abbreviation: TCS) gas, a tetrachlorosilane ($SiCl_4$, abbreviation: STC) gas, a hexachlorodisilane ($Si_2Cl_6$, abbreviation: HCDS) gas, an octachlorotrisilane ($Si_3Cl_s$, abbreviation: OCTS) gas, or the like. Further, instead of the chlorosilane-based gas, it may also be possible to use a fluorosilane-based gas such as a tetrafluorosilane ($SiF_4$) gas, a bromosilane-based gas such as a tetrabromosilane ($SiBr_4$) gas, or an iodosilane-based gas such as a tetraiodosilane ($SiI_4$) gas.

As the inert gas, it may be possible to use a $N_2$ gas or a rare gas such as an Ar gas, a He gas, a Ne gas, or a Xe gas. The same applies to each step to be described later.

[Step S2]

After the step S1 is completed, a N- and H-containing gas is supplied to the wafer 200 in the process chamber 201, that is, the Si-containing layer formed over the wafer 200.

Specifically, the valve 243b is opened to allow the N- and H-containing gas to flow through the gas supply pipe 232b. A flow rate of the N- and H-containing gas is adjusted by the MFC 241b, and the N- and H-containing gas is supplied into the process chamber 201 via the nozzle 249b and is exhausted via the exhaust port 231a. In this operation, the N- and H-containing gas is supplied to the wafer 200 (N- and H-containing gas supply). At this time, the valves 243f to 243h may be opened to allow an inert gas to be supplied into the process chamber 201 via of the nozzles 249a to 249c respectively.

Process conditions in this step are exemplified as follows.
N- and H-containing gas supply flow rate: 0.1 to 10 slm
N- and H-containing gas supply time: 1 to 120 seconds, specifically 1 to 60 seconds in some embodiments
Processing pressure: 1 to 4,000 Pa, specifically 1 to 3,000 Pa in some embodiments Other process conditions are the same as the process conditions in the step S1.

By supplying the N- and H-containing gas to the wafer 200 under the above-mentioned conditions, at least a portion of the Si-containing layer formed over the wafer 200 is nitrided (modified). As a result, a silicon nitride layer (SiN layer) is formed as a layer containing Si and N over the outermost surface of the wafer 200 as a base. When the SiN layer is formed, impurities such as Cl contained in the Si-containing layer constitute gaseous substance containing at least Cl in the process of modifying the Si-containing layer with the N- and H-containing gas and are discharged from the process chamber 201. As a result, the SiN layer has fewer impurities such as Cl than those contained in the Si-containing layer formed in the step S1.

After the SiN layer is formed, the valve 243b is closed to stop the supply of the N- and H-containing gas into the process chamber 201. Then, according to the same process procedures as the purge in the step S1, a gas and the like remaining in the process chamber 201 are removed from the process chamber 201 (purge).

As the N- and H-containing gas, it may be possible to use a hydrogen nitride-based gas such as an ammonia ($NH_3$) gas, a diazene ($N_2H_2$) gas, a hydrazine ($N_2H_4$) gas, or a $N_3H_8$ gas.

[Step S3]

After the step S2 is completed, an O-containing gas is supplied to the wafer 200 in the process chamber 201, that is, the SiN layer formed over the wafer 200.

Specifically, the valve 243c is opened to allow the O-containing gas to flow through the gas supply pipe 232c. A flow rate of the O-containing gas is regulated by the MFC 241c, and the O-containing gas is supplied into the process chamber 201 via the nozzle 249c and is exhausted via the exhaust port 231a. In this operation, the O-containing gas is supplied to the wafer 200 (O-containing gas supply). At this time, the valves 243f to 243h may be opened to allow an inert gas to be supplied into the process chamber 201 via the nozzles 249a to 249c respectively.

Process conditions in this step are exemplified as follows.
O-containing gas supply flow rate: 0.1 to 10 slm
O-containing gas supply time: 1 to 120 seconds, specifically 1 to 60 seconds in some embodiments
Processing pressure: 1 to 4,000 Pa, specifically 1 to 3,000 Pa in some embodiments
Other process conditions are the same as the process conditions in the step S1.

By supplying the O-containing gas to the wafer 200 under the above-mentioned conditions, at least a portion of the SiN layer formed over the wafer 200 is oxidized (modified). As a result, a silicon oxynitride layer (SiON layer) is formed as a layer containing Si, O, and N over the outermost surface of the wafer 200 as the base.

When the SiON layer is formed, impurities such as Cl contained in the SiN layer constitute gaseous substance containing at least Cl in the process of modifying the SiN layer with the O-containing gas and are discharged from the process chamber 201. As a result, the SiON layer has fewer impurities such as Cl than those contained in the SiN layer formed in the step S2.

After the SiON layer is formed, the valve 243c is closed to stop the supply of the O-containing gas into the process chamber 201. Then, according to the same process procedures as the purge in the step S1, a gas and the like remaining in the process chamber 201 are removed from the process chamber 201 (purge).

As the O-containing gas, it may be possible to use an oxygen ($O_2$) gas, an ozone ($O_3$) gas, water vapor ($H_2O$ gas), a hydrogen peroxide ($H_2O_2$) gas, a nitrous oxide ($N_2O$) gas, a nitric oxide (NO) gas, a nitrogen dioxide ($NO_2$) gas, a carbon monoxide (CO) gas, a carbon dioxide ($CO_2$) gas, or the like.

[Performing Set Predetermined Number of Times]

Figure 4A:
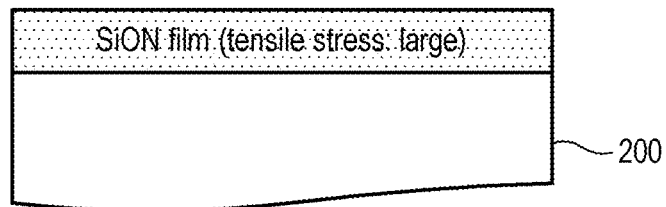
FIG. 4A is an enlarged partial cross-sectional view of a surface of a wafer 200 after a silicon oxynitride film is formed with the surface of the wafer 200 as a base.

By performing a set a predetermined number of times ($n_1$ time, where $n_1$ is an integer of 1 or more), the set including non-simultaneously, that is, without synchronization, performing the steps S1 to S3 described above, a SiON film having a predetermined thickness may be formed over the surface of the wafer 200 as a base, as illustrated in FIG. 4A. The above-described cycle may be performed a plurality of times. That is, the thickness of the SiON layer formed per cycle may be set to be smaller than a desired film thickness, and the above-described cycle may be performed a plurality of times until the thickness of a SiON film formed by stacking SiON layers reaches the desired film thickness.

Further, by performing this step under the above-mentioned process conditions, the SiON film formed over the wafer 200 becomes a film having a relatively large stress, for example, a tensile stress having a magnitude of about 0.4 to 0.5 GPa.

[SiO Film Change]

After the SiON film having the predetermined thickness is formed, an O-containing gas and a H-containing gas are supplied to the wafer 200 in the process chamber 201, that is, the SiON film formed over the wafer 200.

Specifically, the valves 243c and 243e are opened to allow the O-containing gas and the H-containing gas to flow through the gas supply pipes 232c and 232e respectively. Flow rates of the O-containing gas and the H-containing gas flowing through the gas supply pipes 232c and 232e are regulated by the MFCs 241c and 241e, respectively, and the O-containing gas and the H-containing gas are supplied into the process chamber 201 via the nozzles 249c and 249b, respectively. The O-containing gas and the H-containing gas are mixed and react with each other in the process chamber 201 and are then exhausted via the exhaust port 231a. In this operation, water ($H_2O$)-free oxidizing species containing oxygen such as atomic oxygen generated by the reaction between the O-containing gas and the H-containing gas are supplied to the wafer 200 (O-containing gas+H-containing gas). At this time, the valves 243f to 243h may be opened to allow an inert gas to be supplied into the process chamber 201 via the nozzles 249a to 249c.

Process conditions in this step are exemplified as follows.
O-containing gas supply flow rate: 0.1 to 10 slm
H-containing gas supply flow rate: 0.1 to 10 slm
Each gas supply time: 1 to 120 seconds, specifically 1 to 60 seconds in some embodiments
Processing pressure: 1 to 2,000 Pa, specifically 1 to 1,000 Pa in some embodiments Other process conditions are the same as the process conditions in the step S1.

Figure 4B:
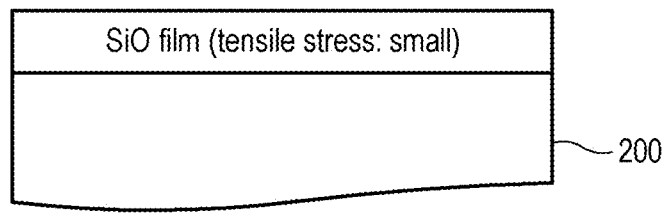
FIG. 4B is an enlarged partial cross-sectional view of the surface of the wafer 200 after the silicon oxynitride film formed with the surface of the wafer 200 as the base is oxidized to be changed into a silicon oxide film.

By supplying the O-containing gas and the H-containing gas to the wafer 200 under the above-mentioned conditions, it is possible to further introduce O into the SiON film by oxidizing the SiON film formed over the wafer 200 by using a strong oxidizing power of the oxidizing species such as atomic oxygen. Further, it is possible to desorb N contained in the SiON film from the SiON film. As a result, as illustrated in FIG. 4B, it is possible to change the SiON film formed over the wafer 200 in the SiON film formation into the SiO film. The SiO film obtained by oxidizing the SiON film is a high-purity and dense SiO film containing little or no N.

Figure 7A:
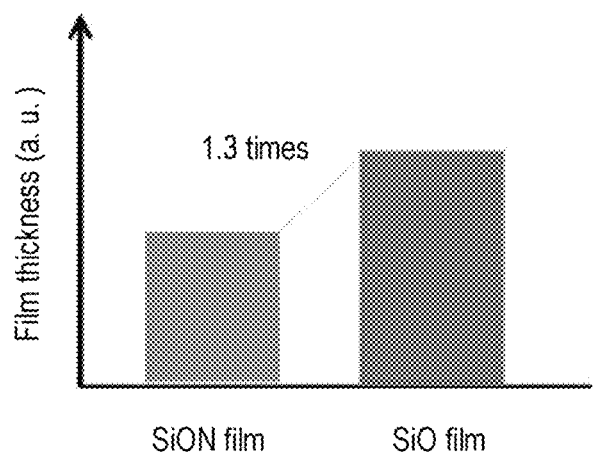
FIG. 7A is a diagram showing measurement results of film thicknesses of a silicon oxynitride film formed over a wafer and a silicon oxide film obtained by oxidizing the silicon oxynitride film.
Figure 8A:
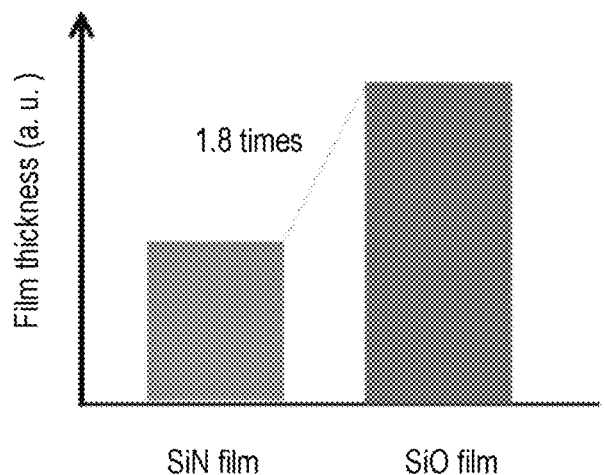
FIG. 8A is a diagram showing measurement results of film thicknesses of a silicon nitride film formed over a wafer and a silicon oxide film obtained by oxidizing the silicon nitride film.

Further, the SiON film expands by introducing O when it is changed into the SiO film by the oxidation. Therefore, the SiO film obtained by oxidizing the SiON film becomes thicker than the SiON film before the oxidation. However, a degree of expansion (an expansion coefficient) of the film before and after the oxidation is smaller than a degree of expansion (an expansion coefficient) of the film before and after the oxidation when the set including the step of supplying the chlorosilane-based gas to the wafer 200 and the step of supplying the N- and H-containing gas to the wafer 200 is performed a predetermined number of times to form the silicon nitride film (SiN film) over the wafer 200 and the SiN film is oxidized to be changed into the SiO film. As illustrated in FIG. 7A, the present disclosers confirmed that the film thickness of the SiO film obtained by oxidizing the SiON film may fall within about 1.3 times the film thickness of the SiON film before the oxidation. On the other hand, as illustrated in FIG. 8A, the present disclosers confirmed that the film thickness of the SiO film obtained by oxidizing the SiN film may increase to about 1.8 times the film thickness of the SiN film before the oxidation. From this point, by using the SiON film as a base film, it is possible to lower the expansion coefficient of the SiO film obtained by oxidizing the base film, as compared with a case where the base film is the SiN film.

Figure 7B:
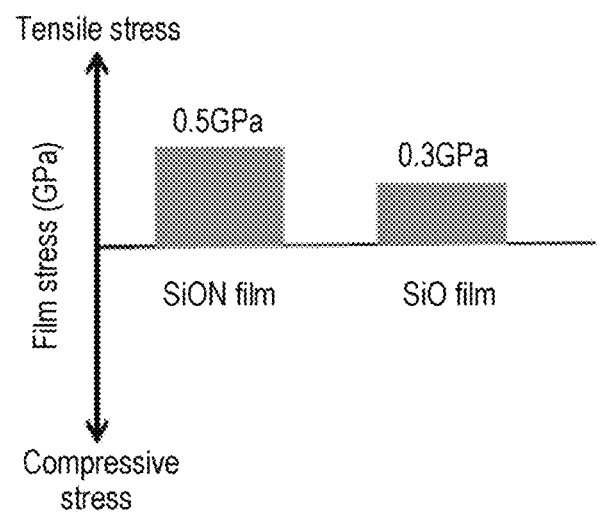
FIG. 7B is a diagram showing measurement results of film stresses in a silicon oxynitride film formed over a wafer and a silicon oxide film obtained by oxidizing the silicon oxynitride film.
Figure 8B:
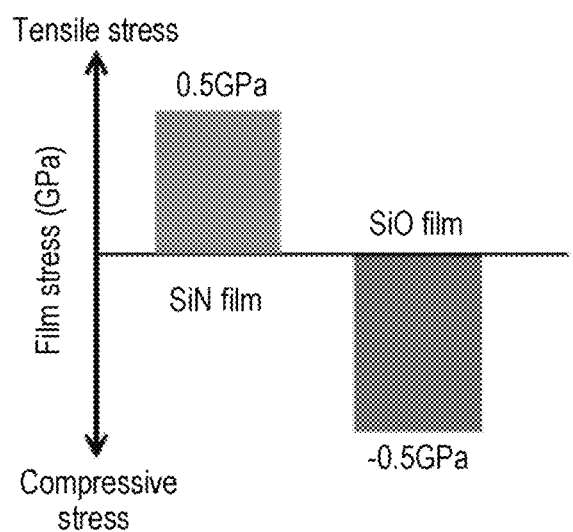
FIG. 8B is a diagram showing measurement results of stresses in a silicon nitride film formed over a wafer and a silicon oxide film obtained by oxidizing the silicon nitride film.

Further, a stress (membrane stress, internal stress, or residual stress) of the SiO film obtained by oxidizing the SiON film is smaller than a stress of the SiON film before the oxidation. This stress is smaller than the stress of the SiO film in the case where the set including the step of supplying the chlorosilane-based gas to the wafer 200 and the step of supplying the N- and H-containing gas to the wafer 200 is performed a predetermined number of times to form the SiN film over the wafer 200 and the SiN film is oxidized to be changed into the SiO film. As illustrated in FIG. 7B, the present disclosers have confirmed that when the SiON film before the oxidation has a tensile stress having a magnitude of about 0.5 GPa, the stress of the SiO film obtained by oxidizing the SiON film may be a tensile stress having a magnitude of about 0.3 GPa which is smaller than 0.5 GPa. On the other hand, as illustrated in FIG. 8B, the present disclosers have confirmed that when the SiN film before the oxidation has a tensile stress having the magnitude of about 0.5 GPa, the stress of the SiO film obtained by oxidizing the SiN film changes from the tensile stress to a compressive stress and the magnitude of the stress may be as large as about 0.5 GPa. In FIGS. 7B and 8B, the tensile stress is represented by "+" and the compressive stress is represented by "−." From this point, by using the SiON film as a base film, it is possible to reduce the stress of the SiO film obtained by oxidizing the base film, as compared with a case where the base film is the SiN film.

After the change of the SiON film to the SiO film by the oxidation is completed, the valves 243c and 243e are closed to stop the supply of the O-containing gas and the H-containing gas into the process chamber 201. Then, a gas and the like remaining in the process chamber 201 are removed from the process chamber 201 (purge) according to the same process procedures as in the purge in the step S1.

As the O-containing gas, it may be possible to use an $O_2$ gas, an $O_3$ gas), a $H_2O$ gas, a $H_2O_2$ gas, a $N_2O$ gas, a NO gas, a $NO_2$ gas, a CO gas, a $CO_2$ gas, or the like. As the H-containing gas, it may be possible to use a $H_2$ gas or a deuterium ($^2H_2$) gas. The $^2H_2$ gas may be also referred to as a $D_2$ gas. In this step, the supply of the H-containing gas may not be carried out, and the O-containing gas alone may be supplied as an oxidizing gas. Further, in this step, at least one selected from the group of the O-containing gas and the H-containing gas may be supplied after being plasma-excited.

[Repeating Cycle]

Figure 4C:
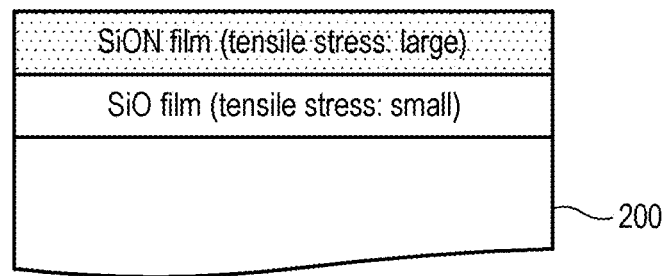
FIG. 4C is an enlarged partial cross-sectional view of the surface of the wafer 200 after a silicon oxynitride film is formed with the silicon oxide film, as a base, formed over the wafer 200 by oxidizing the silicon oxynitride film.
Figure 4D:
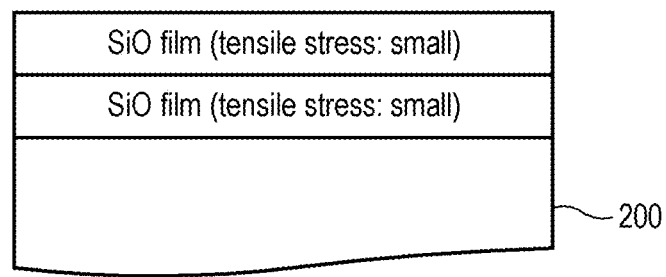
FIG. 4D is an enlarged partial cross-sectional view of the surface of the wafer 200 after the silicon oxynitride film formed with the silicon oxide film, as a base, formed over the wafer 200 by oxidizing the silicon oxynitride film is oxidized to be changed into a silicon oxide film.
Figure 5A:
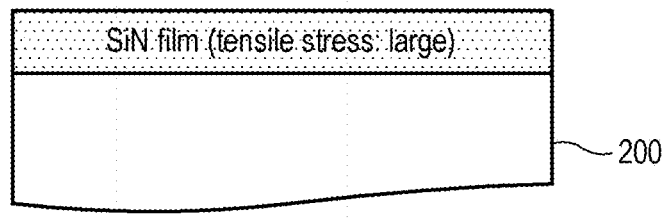
FIG. 5A is an enlarged partial cross-sectional view of a surface of a wafer 200 after a silicon nitride film is formed with the surface of the wafer 200 as a base.
Figure 5B:
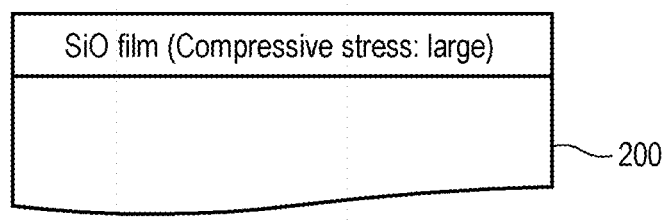
FIG. 5B is an enlarged partial cross-sectional view of the surface of the wafer 200 after the silicon nitride film formed with the surface of the wafer 200 as the base is oxidized to be changed into a silicon oxide film.
Figure 5C:
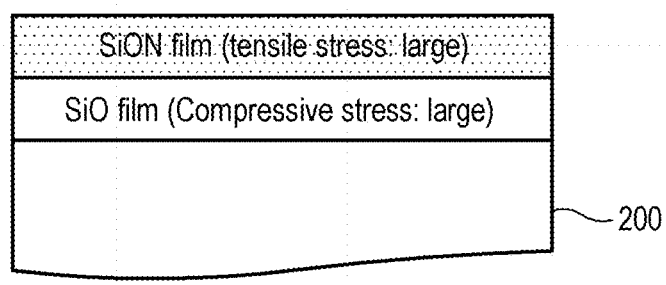
FIG. 5C is an enlarged partial cross-sectional view of the surface of the wafer 200 after a silicon oxynitride film is formed with the silicon oxide film, as a base, formed over the wafer 200 by oxidizing the silicon nitride film.
Figure 5D:
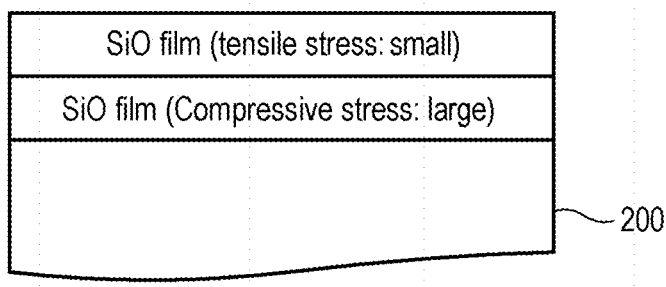
FIG. 5D is an enlarged partial cross-sectional view of the surface of the wafer 200 after the silicon oxynitride film formed with the silicon oxide film, as a base, formed over the wafer 200 by oxidizing the silicon nitride film is oxidized to be changed into a silicon oxide film.
Figure 6A:
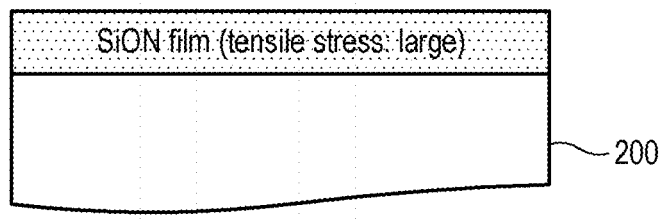
FIG. 6A is an enlarged partial cross-sectional view of a surface of a wafer 200 after a silicon oxynitride film is formed with the surface of the wafer 200 as a base.
Figure 6B:
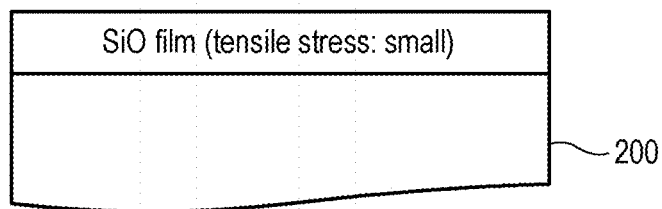
FIG. 6B is an enlarged partial cross-sectional view of the surface of the wafer 200 after the silicon oxynitride film formed with the surface of the wafer 200 as the base is oxidized to be changed into a silicon oxide film.
Figure 6C:
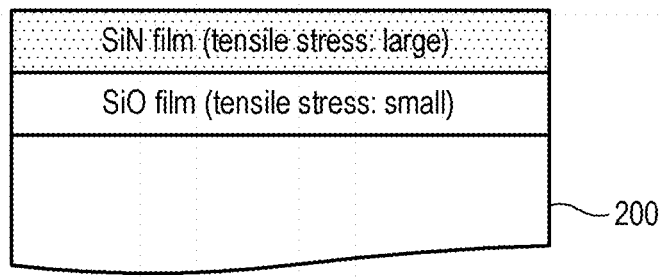
FIG. 6C is an enlarged partial cross-sectional view of the surface of the wafer 200 after a silicon nitride film is formed with the silicon oxide film, as a base, formed over the wafer 200 by oxidizing the silicon oxynitride film.
Figure 6D:
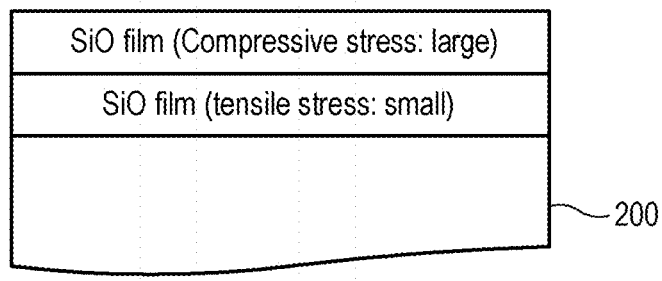
FIG. 6D is an enlarged partial cross-sectional view of the surface of the wafer 200 after the silicon nitride film formed with the silicon oxide film, as a base, formed over the wafer 200 by oxidizing the silicon oxynitride film is oxidized to be changed into a silicon oxide film.

Then, by performing the above-described SiON film formation and SiO film change again in this order, a SiON film may be formed over the SiO film formed over the wafer 200 as a base, as illustrated in FIG. 4C, and the SiON film formed over the SiO film as the base may be changed into a SiO film, as illustrated in FIG. 4D. In this way, by performing a cycle a plurality of times ($n_2$ times, where $n_2$ is an integer of 2 or more), the cycle including non-simultaneously, that is, alternately without synchronization, performing the SiON film formation and the SiO film change, the SiO film having a desired thickness may be formed over the wafer 200. This film becomes a high-purity and dense SiO film containing little or no N, which has excellent insulating characteristics and the like. Further, the SiO film formed by performing the cycle of non-simultaneously performing the SiON film formation and the SiO film change a plurality of times has a stress smaller than that of a SiO film having the same thickness formed by performing the SiON film formation and the SiO film change one time in this order. Further, the above-described cycle may not be performed a plurality of times, but may be performed only one time ($n_2=1$).

(After-Purge and Returning to Atmospheric Pressure)

After the SiO film having the desired thickness is formed over the wafer 200, an inert gas acting as a purge gas is supplied into the process chamber 201 from each of the nozzles 249a to 249c and is exhausted through the exhaust port 231a. Thus, the interior of the process chamber 201 is purged, and a gas and reaction by-products remaining in the process chamber 201 are removed from the process chamber 201 (after-purge). Then, the internal atmosphere of the process chamber 201 is substituted with an inert gas (inert gas substitution) and the internal pressure of the process chamber 201 is returned to the atmospheric pressure (returning to atmospheric pressure).

(Boat Unloading and Wafer Discharging)

Then, the seal cap 219 is moved down by the boat elevator 115 to open the lower end of the manifold 209. Then, the processed wafers 200 supported by the boat 217 are unloaded from the lower end of the manifold 209 to the outside of the reaction tube 203 (boat unloading). After the boat unloading, the shutter 219s is moved and the lower end opening of the manifold 209 is sealed by the shutter 219s via the O-ring 220c (shutter close). The processed wafers 200 are unloaded from the reaction tube 203 and are discharged from the boat 217 (wafer discharging).

(3) Effects of the Embodiments

According to the embodiments, one or more effects set forth below may be achieved.

(a) By performing a cycle a predetermined number of times, the cycle including non-simultaneously performing the SiON film formation and the SiO film change, with the SiON film as the base film, it is possible to suppress the expansion of the SiO film when the base film is oxidized to be changed into the SiO film, as compared with a case of performing a cycle a predetermined number of times, the cycle including non-simultaneously performing the SiN film formation and the SiO film change, with the SiN film as the base film. Further, by performing the SiON film formation and the SiO film change in this order, it is possible to suppress a change in film stress when the base film is oxidized to be changed into the SiO film and to reduce the stress of the SiO film after the base film is changed into the SiO film, as compared with a case of performing the SiN film formation and the SiO film change in this order. In this way, according to the embodiments, it is possible to suppress the "film expansion" and the "change in film stress" before and after the oxidation in the SiO film change and provide a SiO film formed over the wafer 200 with a small internal stress. As a result, it is possible to avoid deformation of an uneven structure such as pillars formed over the surface of the wafer 200 which is the base when forming the SiO film.

(b) By performing a cycle a predetermined number of times, the cycle including non-simultaneously performing the SiON film formation and the SiO film change, with the SiON film as the base film, it is possible to shorten the time for which the base film is oxidized in the SiO film change, as compared with a case of performing a cycle a predetermined number of times, the cycle including non-simultaneously performing the SiN film formation and the SiO film change, with the SiN film as the base film. This makes it possible to improve a productivity of the film-forming process.

(c) By performing a cycle a predetermined number of times, the cycle including non-simultaneously performing the SiON film formation and the SiO film change, it is possible to provide the SiO film formed over the wafer 200 to contain little or no N and have high purity and excellent insulating characteristics.

(d) In the SiO film change, by using the O-containing gas+H-containing gas as an oxidizing gas, it is possible to provide the SiO film formed over the wafer 200 to contain little or no N and have high purity and excellent insulating characteristics. Further, in the SiO film change, since the change of the SiON film to the SiO film by the oxidation can be efficiently performed, it is possible to increase the productivity of the film-forming process.

(e) The above-described effects can be similarly obtained even when the above-described various silane-based gases, the above-described various N- and H-containing gases, and the above-described various O-containing gases are used in the SiON film formation, even when the above-described various O-containing gases and the above-described various H-containing gases are used in the SiO film change, or even when the above-described various inert gases are used in each of these steps.

(4) Modifications

The processing sequence in the embodiments may be modified as in the following modifications. These modifications may be used in proper combination.

Unless otherwise stated, process procedures and process conditions in each step of each modification may be the same as the process procedures and process conditions in each step of the above-described processing sequence.
(Modification 1)

At least one selected from the group of the O concentration and the N concentration of the SiON film formed in the SiON film formation may be controlled to regulate at least one selected from the group of the expansion coefficient of the film when the SiON film is changed into the SiO film in the SiO film change and the internal stress of the SiO film formed in the SiO film change. The O concentration and the N concentration of the SiON film can be adjusted by changing at least one selected from the group of conditions: for example, a type, a partial pressure, a supply flow rate, and a supply time of the O-containing gas and a type, a partial pressure, a supply flow rate, and a supply time of the N- and H-containing gas, in the SiON film formation.

This modification also obtains the same effects as the above-described embodiments. Further, according to the modification, by control of the concentration of an element (O and/or N) constituting the SiON film formed in the SiON film formation, not by control of the oxidation condition in the SiO film change, it is possible to regulate at least one selected from the group of the expansion coefficient of the film when the SiON film is changed into the SiO film in the SiO film change, and the stress of the SiO film formed in the SiO film change.
(Modification 2)

At least one selected from the group of the O concentration and the N concentration of the SiON film formed in the SiON film formation may be changed every predetermined cycle. The O concentration and the N concentration of the SiON film may be regulated every predetermined cycle by changing, every predetermined cycle, at least one selected from the group of conditions: for example, a type, a partial pressure, a supply flow rate, and a supply time of the O-containing gas, and a type, a partial pressure, a supply flow rate, and a supply time of the N- and H-containing gas in the SiON film formation.

This modification also obtains the same effects as the above-described embodiments. Further, according to the modification, it is possible to change and regulate a stress of the SiO film, which has a predetermined thickness formed over the wafer 200, in a thickness direction.
(Modification 3)

The thickness of the SiON film formed in the SiON film formation may be changed every predetermined cycle. The thickness of the SiON film can be regulated every predetermined cycle by changing, every predetermined cycle, the number of sets $n_1$ in the SiON film formation. For example, by making the number of sets $n_1$ in the SiON film formation in a first cycle different from the number of sets $n_1$ in the SiON film formation in at least one subsequent cycle, the thickness of the SiON film formed in the first cycle may be made different from the thickness of the SiON film formed in the at least one subsequent cycle.

This modification also obtains the same effects as the above-described embodiments. Further, according to the modification, it is possible to finely adjust the stress of the SiO film having a predetermined thickness formed over the wafer 200 in the thickness direction.
(Modification 4)

In the SiON film formation, a set including non-simultaneously performing chlorosilane-based gas supply, O-containing gas supply, and N- and H-containing gas supply in this order may be performed a predetermined number of times ($n_1$ times, where $n_1$ is an integer of 1 or more), as in the gas supply sequence shown below.

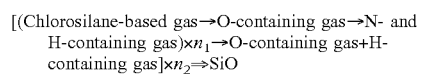

[(Chlorosilane-based gas→O-containing gas→N- and H-containing gas)×$n_1$→O-containing gas+H-containing gas]×$n_2$⇒SiO This modification also obtains the same effects as the above-described embodiments. Further, according to the modification, since a SiON film having a composition (O concentration and/or N concentration) different from that of the SiON film obtained in the SiON film formation in the above-described embodiments may be formed in the SiON film formation, it is possible to regulate at least one selected from the group of the coefficient of expansion of the film in the SiO film change and the internal stress of the SiO film formed in the SiO film change.

(Modification 5)

Like the processing sequence shown below, a SiO film having a predetermined film thickness may also be formed over a wafer 200 by performing a cycle a predetermined number of times ($n_4$ times, where $n_4$ is an integer of 1 or more), the cycle including non-simultaneously performing:

a step of forming a SiN film as a nitride film by supplying a chlorosilane-based gas which is a precursor gas, and a N- and H-containing gas which is a nitriding gas, as film-forming gases, to the wafer 200 (SiN film formation); and a step of changing the SiN film into a SiO film as an oxide film by supplying an O-containing gas and a H-containing gas, as oxidizing gases, to the wafer 200 to oxidize the SiN film (SiO film change).

Further, an oxide film (SiO film) may formed by alternately stacking a first SiO film having a predetermined film thickness and a second SiO film having a predetermined film thickness over the wafer 200 which are formed by performing, a predetermined number of times, a step of forming the first SiO film by performing a cycle a predetermined number of times ($n_2$, where $n_2$ is an integer of 1 or more), the cycle including non-simultaneously performing the SiON film formation and the SiO film change (first SiO film formation), and a step of forming the second SiO film by performing a cycle a predetermined number of times ($n_4$, where $n_4$ is an integer of 1 or more), the cycle including non-simultaneously performing the SiN film formation and the SiO film change (second SiO film formation).

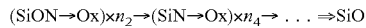

Further, as in the gas supply sequence shown below, in the second SiO film formation of this modification, a set including a step of supplying a chlorosilane-based gas to the wafer 200 and a step of supplying a N- and H-containing gas to the wafer 200 may be performed a predetermined number of times ($n_3$ times, where $n_3$ is an integer of 1 or more) in the SiN film formation. Process conditions in each step may be the same as the process conditions in each step in the above-described embodiments.

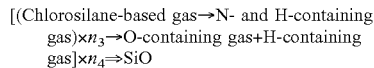

Further, in this modification, the first SiO film formation and the second SiO film formation may be performed in the same process chamber 201 (in-situ) of the above-described substrate processing apparatus. The above-described film-forming gas supply system and oxidizing gas supply system may be used both when forming the first SiO film and when forming the second SiO film. That is, these gas supply systems may be shared between when forming the first SiO film and when forming the second SiO film.

This modification also obtains the same effects as the above-described embodiments. Further, according to the modification, it is possible to regulate, in the thickness direction, the stress of the SiO film formed over the wafer 200, that is, the SiO film formed by alternately stacking the first SiO film and the second SiO film.

Further, in this modification, the thickness of the first SiO film having a predetermined film thickness may be different from that of the second SiO film having a predetermined film thickness. The thickness of the first SiO film may be regulated, for example, by varying the number of sets $n_1$ in the SiON film formation in the first SiO film formation. Further, the thickness of the second SiO film can be regulated, for example, by varying the number of sets $n_3$ in the SiN film formation in the second SiO film formation. That is, the thicknesses of the first SiO film and the second SiO film may be made different from each other by changing at least one selected from the group of the number of sets $n_1$ and $n_3$. By making the thicknesses of the first SiO film and the second SiO film different from each other in this way, it is possible to finely regulate, in the thickness direction, the stress of the SiO film formed over the wafer 200, that is, the SiO film formed by alternately stacking the first SiO film and the second SiO film.

Further, in this modification, a film having a tensile stress may be formed as the first SiO film having the predetermined film thickness, and a film having a compressive stress may be formed as the second SiO film having the predetermined film thickness. By making the first SiO film and the second SiO film have opposite stresses in this way, it is possible to finely regulate the stress of the SiO film formed over the wafer 200, that is, the SiO film formed by alternately stacking the first SiO film and the second SiO film such that the stresses of the first SiO film and the second SiO films may be canceled out in the thickness direction. As described with reference to FIGS. 7B and 8B, the present disclosers confirmed that the first SiO film tends to have a tensile stress and the second SiO film tends to have a compressive stress.

Further, in this modification, of the first SiO film having the predetermined film thickness and the second SiO film having the predetermined film thickness, a film having a larger absolute value of the film stress may be made thinner than a film having a smaller absolute value of the film stress. That is, of the first SiO film having the predetermined film thickness and the second SiO film having the predetermined film thickness, the film having the smaller absolute value of the film stress may be made thicker than the film having the larger absolute value of the film stress. As described below, such film thickness regulation may be effective when the first SiO film and the second SiO film have opposite film stresses.

In this way, by varying the thicknesses of the first SiO film and the second SiO film according to the respective film stresses, it is possible to finely regulate more appropriately, in the thickness direction, the stress of the SiO film formed over the wafer 200, that is, the SiO film formed by alternately stacking the first SiO film and the second SiO film (hereinafter also referred to as a stacked SiO film). For example, of the first SiO film and the second SiO film, by making the film having the larger absolute value of the film stress thinner than the film having the smaller absolute value of the film stress, it is possible to finely regulate the stress of the stacked SiO film formed over the wafer 200 such that a degree of film stress of the film having the larger absolute value of the film stress may decrease. Further, for example, of the first SiO film and the second SiO film, by making the film having the smaller absolute value of the film stress thicker than the film having the larger absolute value of the film stress, it is possible to finely regulate the stress of the stacked SiO film formed over the wafer 200 such that a degree of film stress of the film having the smaller absolute value of the film stress may increase.

As described above with reference to FIGS. 7B and 8B, the present inventors confirmed that an absolute value of the compressive stress of the second SiO film may be larger than an absolute value of the tensile stress of the first SiO film. In this case, by making the second SiO film having the predetermined film thickness thinner than the first SiO film having the predetermined film thickness, it is possible to finely regulate the stress of the stacked SiO film formed over the wafer 200 such that the stresses of the first SiO film and the second SiO film are canceled out more appropriately in the thickness direction. For example, it is possible to alleviate the tendency of the stress of the stacked SiO film to be biased toward the compressive stress. Further, in a case where the first SiO film and the second SiO film have opposite film stresses and different absolute values of the respective film stresses, the SiO film having a smaller absolute value of the film stress may be made thicker than the SiO film having a larger absolute value of the film stress in some embodiments. That is, the SiO film having the larger absolute value of the film stress may be made thinner than the SiO film having the smaller absolute value of the film stress in some embodiments.

Further, in this modification, a set including: a step of forming the film having the smaller absolute value of the film stress; a step of forming the film having the larger absolute value of the film stress; and a step of forming the film having the smaller absolute value of the film stress of the first SiO film having the predetermined film thickness and the second SiO film having the predetermined film thickness may be performed a predetermined number of times. Further, regulation of such a stacking order is further effective when the first SiO film and the second SiO film have opposite film stresses.

As described above, by regulating the stacking order of the first SiO film and the second SiO film according to the film stress, a stacked structure in which the film having the larger absolute value of the film stress is sandwiched from both sides by the films having the smaller absolute value of the film stress may be formed, whereby it is possible to finely regulate the stress of the stacked SiO film formed over the wafer 200 such that the stresses of the respective SiO film are canceled out in the thickness direction more appropriately.

For example, in a case where the absolute value of the film stress (for example, compressive stress) of the second SiO film is larger than the absolute value of the film stress (for example, tensile stress) of the first SiO film, a set including the first SiO film formation, the second SiO film formation, and the first SiO film formation may be performed a predetermined number of times, as in the processing sequence shown below. In this case, the first SiO film formation and the second SiO film formation are alternately performed a plurality of times, and the first SiO film formation is performed at the beginning and the end. In this case, it is possible to make the structure of the stacked SiO film such that the second SiO film, which may have a relatively large compressive stress, is sandwiched between the first SiO films which tend to have a relatively small tensile stress. As a result, it is possible to finely regulate the stresses of the first SiO film and the second SiO film such that the stresses are canceled out more appropriately. Therefore, for example, it is possible to alleviate the tendency of the stress of the stacked SiO film to be biased toward the compressive stress in a well-balanced manner. Further, for example, since the stress on a bottom surface side of the stacked SiO film may be made equal to the stress on a front surface side of the stacked SiO film, it is possible to appropriately prevent a stress balance of the stacked SiO film from being broken.

$(SiON \rightarrow Ox) \times n_2 \rightarrow (SiN \rightarrow Ox) \times n_4 \rightarrow \ldots \rightarrow (SiON \rightarrow Ox) \times n_2 \Rightarrow SiO$ Further, in this modification, a step of forming the film having the smaller absolute value of the film stress, a step of forming the film having the larger absolute value of the film stress, and a step of forming the film having the smaller absolute value of the film stress of the first SiO film having the predetermined film thickness and the second SiO film having the predetermined film thickness may be performed in this order. Further, regulation of such a stacking order is further effective when the first SiO film and the second SiO film have opposite film stresses.

As described above, by regulating the stacking order of the first SiO film and the second SiO film according to the film stress, a stacked structure in which the film having the larger absolute value of the film stress is sandwiched from both sides by the films having the smaller absolute value of the film stress may be formed, whereby it is possible to finely adjust the stress of the stacked SiO film formed over the wafer 200 the stresses of the respective SiO film are canceled out in the thickness direction more appropriately.

For example, in a case where the absolute value of the film stress (for example, compressive stress) of the second SiO film is larger than the absolute value of the film stress (for example, tensile stress) of the first SiO film, the first SiO film formation, the second SiO film formation, and the first SiO film formation may be performed in this order, as in the processing sequence shown below. In this case, the same effects as in the above-describes case in which the set including the first SiO film formation, the second SiO film formation, and the first SiO film formation is performed a predetermined number of times are obtained.

$(SiON \rightarrow Ox) \times n_2 \rightarrow (SiN \rightarrow Ox) \times n_4 \rightarrow (SiON \rightarrow Ox) \times n_2 \Rightarrow SiO$ (Modification 6)

As in the gas supply sequence described below, in the SiON film formation of the above-described embodiments, a set including a step of supplying a first silane-based gas as a first precursor gas to the wafer 200, a step of supplying a second silane-based gas as a second precursor gas to the wafer 200, a step of supplying a N- and H-containing gas as a nitriding gas to the wafer 200, and a step of supplying an O-containing gas to the wafer 200 may be performed a predetermined number of times ($n_1$ times, where $n_1$ is an integer of 1 or more). The first silane-based gas and the second silane-based gas have different molecular structures, and each of which has characteristics to be described below.

[(First silane-based gas→Second silane-based gas→N- and H-containing gas→O-containing gas)$\times n_1$→O-containing gas+H-containing gas]$\times n_2 \Rightarrow$SiO Further, as in the gas supply sequence described below, in the SiN film formation of the above-described modification 5, a set including a step of supplying a first silane-based gas as a first precursor gas to the wafer 200, a step of supplying a second silane-based gas as a second precursor gas to the wafer 200, and a step of supplying a N- and H-containing gas as a nitriding gas to the wafer 200 may be performed a predetermined number of times ($n_3$ times, where $n_3$ is an integer of 1 or more). Further, in this case, the first silane-based gas and the second silane-based gas have different molecular structures, and each of which has characteristics to be described below.

[(First silane-based gas→Second silane-based gas→N- and H-containing gas)$\times n_3$→O-containing gas+H-containing gas]$\times n_4 \Rightarrow$SiO In either case, the first silane-based gas and the second silane-based gas may be supplied from the above-described first precursor gas supply system and second precursor gas supply system, respectively.

In these cases, process conditions of the step of supplying the first silane-based gas and the step of supplying the second silane-based gas may be the same as the process conditions in the step 1 of the above-described embodiments respectively. Further, by setting the supply time of the first silane-based gas to be equal to or longer than the supply time of the second silane-based gas, specifically by setting the supply time of the first silane-based gas to be longer than the supply time of the second silane-based gas, effects to be described below may be obtained more sufficiently. Process conditions in the step of supplying the N- and H-containing gas and the step of supplying the O-containing gas may be the same as the process conditions in the step 2 and the step 3 of the above-described embodiments, respectively.

According to this modification, the same effects as the above-described embodiments are obtained.

Further, according to this modification, by using two types of silane-based gases, a cycle rate (thickness of the SiON layer or the SiN layer formed per cycle) in the SiON film formation and the SiN film formation may be made larger than that in a case of using one type of silane-based gas, whereby it is possible to increase the productivity of the film-forming process.

Further, in this modification, a gas that is more difficult to decompose (more difficult to adsorb or less reactive) than the second silane-based gas under the same conditions may be used as the first silane-based gas. By selecting the type of gas in this way, it is possible to improve step coverage characteristics of the SiON film or SiN film as the base film formed over the wafer 200, that is, the SiO film obtained by oxidizing these films, while increasing the cycle rate. For example, by using a gas containing one Si atom in one molecule as the first silane-based gas and using a gas containing two or more Si atoms in one molecule as the second silane-based gas, it is possible to achieve the aforementioned effects, that is, it is possible to improve the step coverage characteristics while increasing the cycle rate. For example, when a HCDS gas or an OCTS gas is used as the first silane-based gas, a MCS gas, a DCS gas, a TCS gas, a STC gas, a $SiF_4$ gas, a $SiBr_4$ gas, a $SiI_4$ gas, or the like may be used as the second silane-based gas.

Other Embodiments of the Present Disclosure

The embodiments of the present disclosure have been described above.

However, the present disclosure is not limited to the above-described embodiments, but various modifications may be made without departing from the gist thereof.

For example, examples in which the SiON film formation and the SiO film change are performed in the same process chamber 201 (in-situ) have been described in the above-described embodiments. However, the SiON film formation and the SiO film change may be performed in different process chambers (ex-situ). Further, examples in which when a plurality of SiO films are stacked over the wafer 200, each SiO film is formed in the same process chamber 201 (in-situ) have been described in the above-described embodiments. However, each SiO film may be formed in different process chambers (ex-situ).

In a case where a series of processes are performed in-situ, the wafer 200 is not exposed to the atmosphere during the processes and the series of process may be performed consistently while the wafer 200 is kept under vacuum, whereby the substrate processing may be performed stably. Further, in a case where some processes are performed ex-situ, an internal temperature of each process chamber may be set in advance to, for example, a processing temperature in each process or a temperature close to the processing temperature, such that a time for which the temperature is regulated may be shortened, thereby increasing the production efficiency.

Further, for example, examples in which the SiO film is formed over the wafer 200 have been described in the above-described embodiments. However, the present disclosure is not limited to the embodiments, but as in the processing sequence described below, the present disclosure may also be applied to a case in which a metal-based oxide film such as a titanium oxide film (TiO film), an aluminum oxide film (AlO film), a hafnium oxide film (HfO film), and a zirconium oxide film (ZrO film) is formed over the wafer 200. Further, in this case, the same effects as the above-described embodiments are obtained.

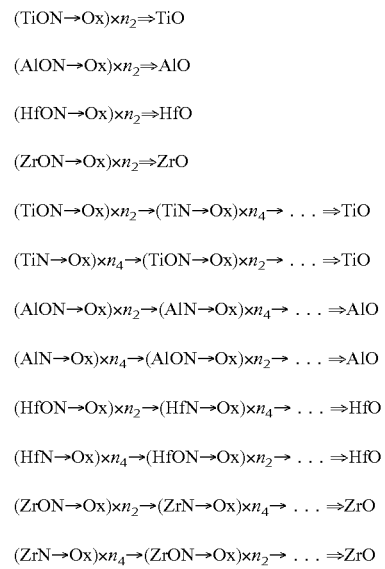

Recipes used in each process may be provided individually according to processing contents and may be stored in the memory 121c via a telecommunication line or the external memory 123. Moreover, at the beginning of each process, the CPU 121a may properly select an appropriate recipe from the recipes stored in the memory 121c according to the processing contents. Thus, it is possible for a single substrate processing apparatus to form films of various types, composition ratios, qualities, and thicknesses with enhanced reproducibility. Further, it is possible to reduce an operator's burden and to quickly start each process while avoiding an operation error.

The recipes mentioned above are not limited to newly-provided ones but may be provided, for example, by modifying existing recipes that are already installed in the substrate processing apparatus. Once the recipes are modified, the modified recipes may be installed in the substrate processing apparatus via a telecommunication line or a recording medium storing the recipes. In addition, the existing recipes already installed in the existing substrate processing apparatus may be directly modified by operating the input/output device 122 of the substrate processing apparatus.

Examples in which a film is formed by using a batch-type substrate processing apparatus capable of processing a plurality of substrates at a time have been described in the above-described embodiments. The present disclosure is not limited to the above-described embodiments, but may be suitably applied, for example, to a case where a film is formed by using a single-wafer type substrate processing apparatus configured to process a single substrate or several substrates at a time.

In addition, examples in which a film is formed by using a substrate processing apparatus provided with a hot-wall-type process furnace have been described in the above-described embodiments. The present disclosure is not limited to the above-described embodiments, but may be suitably applied to a case where a film is formed by using a substrate processing apparatus provided with a cold-wall-type process furnace.

Even in the case of using these substrate processing apparatuses, each process may be performed according to the same processing procedures and process conditions as those in the above-described embodiments, and the same effects as the above-described embodiments are achieved.

The above-described embodiments may be used in proper combination. The processing procedures and process conditions used in this case may be the same as, for example, the processing procedures and process conditions in the above-described embodiments.

According to the present disclosure in some embodiments, it is possible to improve a film quality of an oxide film formed over a substrate.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of processing a substrate, comprising:
    forming a first film to have a first predetermined film thickness over the substrate by performing a first cycle a first predetermined number of times, the first cycle including non-simultaneously performing:
        (a1) forming an oxynitride film by supplying a first film-forming gas to the substrate; and
        (a2) changing the oxynitride film into a first oxide film by supplying a first oxidizing gas to the substrate to oxidize the oxynitride film; and
    forming a second film to have a second predetermined film thickness over the substrate by performing a second cycle a second predetermined number of times, the second cycle including non-simultaneously performing:
        (b1) forming a nitride film by supplying a second film-forming gas to the substrate; and
        (b2) changing the nitride film into a second oxide film by supplying a second oxidizing gas to the substrate to oxidize the nitride film,
    wherein an oxide film formed by stacking the first film and the second film is formed over the substrate by performing the act of forming the first film and the act of forming the second film a third predetermined number of times.

2. The method of claim 1, wherein at least one selected from the group of a film expansion coefficient when changing the oxynitride film into the first oxide film in (a2) and a film stress of the first oxide film formed in (a2) is regulated by controlling at least one selected from the group of an oxygen concentration of the oxynitride film formed in (a1) and a nitrogen concentration of the oxynitride film formed in (a1).

3. The method of claim 1, wherein at least one selected from the group of an oxygen concentration of the oxynitride film formed in (a1) and a nitrogen concentration of the oxynitride film formed in (a1) is changed whenever the first cycle is performed a second predetermined number of times.

4. The method of claim 1, wherein a thickness of the oxynitride film formed in (a1) is changed whenever the first cycle is performed a second predetermined number of times.

5. The method of claim 1, wherein the first film and the second film have thicknesses different from each other.

6. The method of claim 1, wherein a film stress of the first film is a tensile stress, and
    wherein a film stress of the second film is a compressive stress.

7. The method of claim 1, wherein an absolute value of a film stress of one film of the first film and the second film is larger than an absolute value of a film stress of the other film of the first film and the second film, and
    wherein a thickness of the one film is smaller than a thickness of the other film.

8. The method of claim 1, further comprising performing a set a fourth predetermined number of times, the set including performing:
    forming one film of the first film and the second film;
    forming the other film of the first film and the second film; and
    forming the one film of the first film and the second film,
        wherein an absolute value of a film stress of the one film is smaller than an absolute value of a film stress of the other film.

9. The method of claim 1, further comprising sequentially performing:
    forming one film of the first film and the second film;
    forming the other film of the first film and the second film; and
    forming the one film of the first film and the second film,
    wherein an absolute value of a film stress of the one film is smaller than an absolute value of a film stress of the other film.

10. The method of claim 1, wherein (a1) includes performing a set a second predetermined number of times, the set including performing:
    supplying a precursor gas as the first film-forming gas to the substrate;
    supplying a nitriding gas as the first film-forming gas to the substrate; and
    supplying an oxidizing gas as the first film-forming gas to the substrate.

11. The method of claim 10, wherein the act of supplying the precursor gas includes:
    supplying a first precursor gas as the precursor gas to the substrate; and
    supplying a second precursor gas as the precursor gas to the substrate.

12. The method of claim 11, wherein the first precursor gas is more difficult to decompose than the second precursor gas under same conditions.

13. The method of claim 11, wherein the first precursor gas contains one silicon atom in one molecule, and the second precursor gas contains two or more silicon atoms in one molecule.

14. The method of claim 1, wherein (b1) includes performing a set a fourth predetermined number of times, the set including performing:

supplying a precursor gas as the second film-forming gas to the substrate; and supplying a nitriding gas as the second film-forming gas to the substrate.

15. The method of claim 14, wherein the act of supplying the precursor gas includes:

supplying a first precursor gas as the precursor gas to the substrate; and supplying a second precursor gas as the precursor gas to the substrate.

16. The method of claim 1, wherein the act of forming the first film and the act of forming the second film are performed in the same process chamber.

17. The method of claim 1, wherein the act of forming the first film and the act of forming the second film are performed in different process chambers.

18. A method of manufacturing a semiconductor device comprising the method of claim 1.

19. A substrate processing apparatus comprising:

a process chamber in which a substrate is processed;

a first film-forming gas supply system configured to supply a first film-forming gas to the substrate in the process chamber;

a first oxidizing gas supply system configured to supply a first oxidizing gas to the substrate in the process chamber;

a second film-forming gas supply system configured to supply a second film-forming gas to the substrate in the process chamber;

a second oxidizing gas supply system configured to supply a second oxidizing gas to the substrate in the process chamber; and a controller configured to be capable of controlling the first film-forming gas supply system and the first oxidizing gas supply system to perform a process of forming a first film to have a first predetermined film thickness over the substrate in the process chamber by performing a first cycle a first predetermined number of times, the first cycle including non-simultaneously performing:

(a1) forming an oxynitride film by supplying the first film-forming gas to the substrate; and (a2) changing the oxynitride film into a first oxide film by supplying the first oxidizing gas to the substrate to oxidize the oxynitride film, and wherein the controller is further configured to be capable of controlling the first film-forming gas supply system, the first oxidizing gas supply system, the second film-forming gas supply system, and the second oxidizing gas supply system to perform a process including:

forming a second film to have a second predetermined film thickness over the substrate in the process chamber by performing a second cycle a second predetermined number of times, the second cycle including non-simultaneously performing:

(b1) forming a nitride film by supplying the second film-forming gas to the substrate; and (b2) changing the nitride film into a second oxide film by supplying the second oxidizing gas to the substrate to oxidize the nitride film; and forming an oxide film formed by stacking the first film and the second film over the substrate by performing the act of forming the first film and the act of forming the second film a third predetermined number of times.

20. A non-transitory computer-readable recording medium storing a program that causes, by a computer, a substrate processing apparatus to perform a process including:

forming a first film to have a first predetermined film thickness over a substrate in a process chamber of the substrate processing apparatus by performing a first cycle a first predetermined number of times, the first cycle including non-simultaneously performing:

(a1) forming an oxynitride film by supplying a first film-forming gas to the substrate; and (a2) changing the oxynitride film into a first oxide film by supplying a first oxidizing gas to the substrate to oxidize the oxynitride film;

forming a second film to have a second predetermined film thickness over the substrate in the process chamber by performing a second cycle a second predetermined number of times, the second cycle including non-simultaneously performing:

(b1) forming a nitride film by supplying a second film-forming gas to the substrate; and (b2) changing the nitride film into a second oxide film by supplying a second oxidizing gas to the substrate to oxidize the nitride film; and forming an oxide film formed by stacking the first film and the second film over the substrate by performing the act of forming the first film and the act of forming the second film a third predetermined number of times.

* * * * *